(12) United States Patent
Chen et al.

(10) Patent No.: US 8,629,706 B2
(45) Date of Patent: Jan. 14, 2014

(54) POWER SWITCH AND OPERATION METHOD THEREOF

(75) Inventors: Hsu-Shun Chen, Toufen Town (TW);
Cheng-Hsiung Kuo, Jhubei (TW);
Gu-Huan Li, Zhubei (TW); Yue-Der Chih, Hsinchu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 0 days.

(21) Appl. No.: 13/272,584

(22) Filed: Oct. 13, 2011

(65) Prior Publication Data

US 2013/0093499 A1     Apr. 18, 2013

(51) Int. Cl.
*H03L 5/00*     (2006.01)

(52) U.S. Cl.
USPC .......................................................... 327/333

(58) Field of Classification Search
None
See application file for complete search history.

(56) References Cited

U.S. PATENT DOCUMENTS

| | | | |
|---|---|---|---|
| 6,750,696 B2 * | 6/2004 | Shimada et al. | 327/333 |
| 6,985,022 B2 * | 1/2006 | Kanno et al. | 327/333 |
| 7,952,389 B2 * | 5/2011 | Aoki | 326/68 |
| 2010/0201427 A1 | 8/2010 | van den Berg et al. | |

* cited by examiner

*Primary Examiner* — Lincoln Donovan
*Assistant Examiner* — Khareem E Almo
(74) *Attorney, Agent, or Firm* — Lowe Hauptman & Ham, LLP

(57) ABSTRACT

A power switch includes a control circuit, a cross-coupled amplifier, a first switching circuit coupled between a first output terminal and the first controlled ground terminal, and a second switching circuit coupled between a second output terminal and the second controlled ground terminal. The control circuit is configured to connect the second controlled ground terminal to a ground during a first period that a voltage level at the first output terminal is switched from the ground to a first voltage level and to set the second controlled ground terminal at an elevated ground level during a second period that the voltage level at the first output terminal remains at the first voltage level.

19 Claims, 5 Drawing Sheets

POWER SWITCH AND OPERATION METHOD THEREOF

BACKGROUND

In a semiconductor integrated circuit (IC), a power switch is used to selectively connect or disconnect a circuit block with/from a power supply. The semiconductor IC may have a plurality of power domains defined therein, and electrical components within the same power domain are driven by the same voltage power supply(s) and/or ground. Some of the power domains may be driven by a low-voltage power supply, and some of the power domains may be driven by a high-voltage power supply having a voltage higher than that of the low-voltage power supply. When a power switch is implemented to selectively bridge a circuit block with the high-voltage power supply, the electrical components, such as a Metal-Oxide Semiconductor Field Effect Transistor (MOS-FET), of the power switch may be subjected to a large voltage drop. Thus, the electrical components of the power switch, compared with other electrical components not used as a part of the power switch, may have a higher level of oxide stress and current leakage. The higher level of oxide stress increases the risk of a transistor breakdown.

DESCRIPTION OF THE DRAWINGS

One or more embodiments are illustrated by way of examples, and not by limitation, in the figures of the accompanying drawings, wherein elements having the same reference numeral designations represent like elements throughout and wherein.

DETAILED DESCRIPTION

Figure 1:
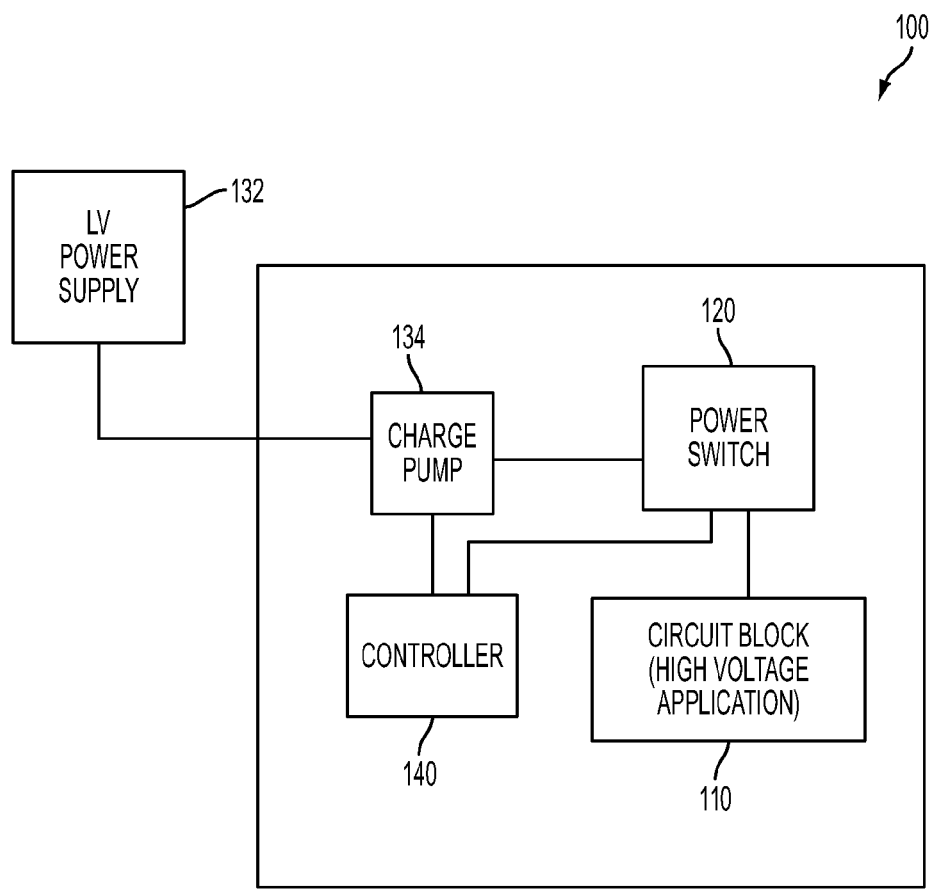
FIG. 1 is a block diagram of a semiconductor IC having a circuit block for high-voltage application and a power switch in accordance with some embodiments.

It is understood that the following disclosure provides many different embodiments, or examples, for implementing different features of the disclosure. Specific examples of components and arrangements are described below to simplify the present disclosure. These are merely examples and are not intended to be limiting. In accordance with the standard practice in the industry, various features in the drawings may not be drawn to scale and are used for illustration purposes. Moreover, the formation of a feature on, connected to, and/or coupled to another feature in the present disclosure that follows may include embodiments in which the features are formed in direct contact, and may also include embodiments in which additional features may be formed interposing the features, such that the features may not be in direct contact.

FIG. 1 is a block diagram of a semiconductor IC 100 in accordance with some embodiments. The semiconductor IC 100 has a circuit block 110 for high-voltage application, a power switch 120, at least one low-voltage power domain driven by a low-voltage power supply 132 and a high-voltage power domain driven by a high-voltage power supply (e.g., the charge pump 134). For example, the semiconductor IC 100 has a charge pump 134 connected to the low-voltage power supply 132, converts the received power from the low-voltage power supply 132 to a higher voltage level, and acts as the high-voltage power supply 134 for the circuit block 110. In some embodiments, the semiconductor IC 100 includes a non-volatile memory circuit (not shown) and the low-voltage power supply 132 generates a "low-voltage level" at from about 1.2 volts to 5 volts, and the high-voltage power supply 134 generates a "high-voltage level" at from about 7.5 volts to 18 volts.

The power switch 120 is coupled between the charge pump 134 and the circuit block 110 to selectively connect or disconnect the circuit block 110 and the charge pump 134 (i.e., the high-voltage power supply). The semiconductor IC 100 further includes a controller 140 coupled to the charge pump 134 and the power switch 120 to control the operation of the charge pump and the switching of the power switch. In some embodiments, the semiconductor IC 100 is connected to an external high-voltage power supply. In such a configuration, the charge pump 134 and the control path between the controller 140 and the charge pump are omitted.

Figure 2:
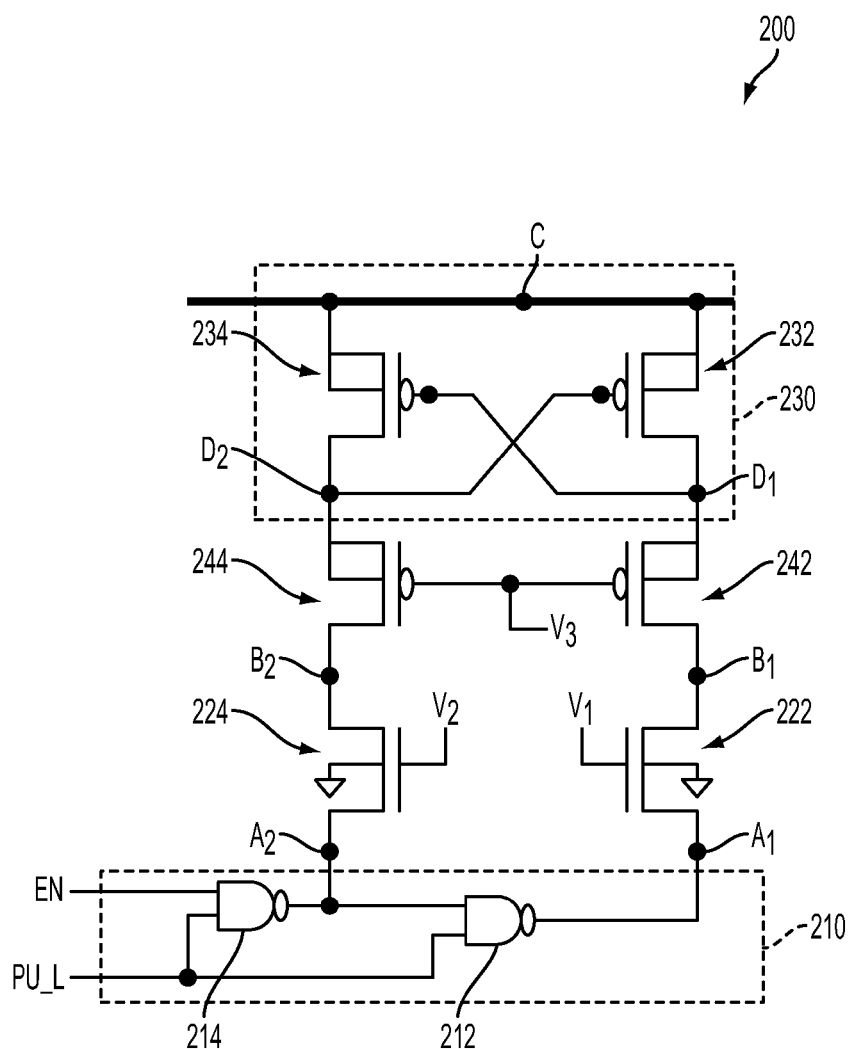
FIG. 2 is a circuit diagram of a power switch in accordance with some embodiments.

FIG. 2 is a circuit diagram of a power switch 200 in accordance with some embodiments. The power switch 200 is suitable for use as the power switch 120 depicted in FIG. 1. The power switch 200 includes a control circuit 210, a first switching circuit 222, and a second switching circuit 224. The power switch 200 further includes a cross-coupled amplifier 230 having a power node C, a first input/output node $D_1$, a second input/output node $D_2$, a first load 242, and a second load 244.

The control circuit 210 has a first controlled ground terminal (or node) $A_1$ and a second controlled ground terminal (or node) $A_2$. The first switching circuit 222 is coupled between a first output terminal (or node) $B_1$ and the first controlled ground terminal $A_1$, and the second switching circuit 224 is coupled between a second output terminal (or node) $B_2$ and the second controlled ground terminal $A_2$.

The power node C is coupled to a high-voltage power supply and configured to be set at a first voltage level (i.e., at a high-voltage level from the high-voltage power supply). The first input/output node $D_1$ is coupled to the first switching circuit 222, and the second input/output node $D_2$ is coupled to the second switching circuit 224. The first load 242 is coupled between the first switching circuit 222 and the first input/output node $D_1$ and the second load 244 is coupled between the second switching circuit 224 and the second input/output node $D_2$.

The control circuit 210 is set to operate within a power domain defined by the ground and a second voltage level less than the first voltage level. For example, the low voltage level is from the low voltage power supply. The first switching circuit 222 is an N-channel MOSFET (NMOS transistor) that is turned on or turned off in response to a voltage level of the first controlled ground terminal $A_1$. The second switching circuit 224 is also an NMOS transistor that is turned on or turned off in response to a voltage level of the second controlled ground terminal $A_2$. The gates of the first switching circuit 222 and the second switching circuit 224 are biased by voltage $V_1$ and $V_2$, respectively. In some embodiments, the gates of the first switching circuit 222 and the second switching circuit 224 are biased at the second voltage level.

The first load 242 and the second load 244 are P-channel MOSFETs (PMOS transistors). In some embodiments, the gates of the first load 242 and the second load 244 are biased by voltage $V_3$, which has a voltage level less than the first voltage level. In at least one embodiment, the gates of the first load 242 and the second load 244 are biased at a voltage level equal to one-half of the first voltage level.

The cross-coupled amplifier 230 includes a first PMOS transistor 232 and a second PMOS transistor 234. The first PMOS transistor 232 has a source terminal, a drain terminal, and a gate terminal, and the source terminal of the first PMOS transistor 232 is connected to the power node C. The second PMOS transistor 234 has a source terminal, a drain terminal, and a gate terminal, and the source terminal of the second PMOS transistor 234 is connected to the power node C. The gate terminal of the first PMOS transistor 232 is connected to the second input/output node $D_2$, and the gate terminal of the second PMOS transistor 234 is connected to the first input/output node $D_1$. In some embodiments, the first PMOS transistor 232 and the second PMOS transistor 234 have the same channel width and length. In at least one embodiment, the channel width of the first PMOS transistor 232 and the second PMOS transistor 234 ranges from about 0.6 μm to 3 μm, and the channel length of the first PMOS transistor 232 and the second PMOS transistor 234 ranges from about 0.6 μm to 1.5 μm.

The control circuit 210 receives an enable signal EN and a pull-up signal PU_L and controls the output voltage level at the first output terminal $B_1$ by controlling the on/off state of the first switching circuit 222 and the second switching circuit 224. In some embodiments, during a first period that a voltage level at the first output terminal $B_1$ is switched from the ground to the first voltage level, the second controlled ground terminal $A_2$ is connected to the ground, and the first controlled ground terminal $A_1$ is set at the second voltage level. Therefore, the first switching circuit 222 is turned off and the second switching circuit 224 is turned on. The voltage levels at the second output terminal $B_2$ and the second input/output node $D_2$ are pulled toward the ground, and thus the voltage levels at the first output terminal $B_1$ and the first input/output node $D_1$ are pulled toward the first voltage level. Then, during a second period that the voltage level at the first output terminal $B_1$ remains at the first voltage level, the second controlled ground terminal $A_2$ is set at an elevated ground level in response to the enable signal EN and the pull-up signal PU_L. The elevated ground level is between the ground and the first voltage level. In some embodiments, the control circuit 210 is powered by the low-voltage power supply, and the elevated ground level is the first voltage level.

In at least one embodiment, when the first output terminal $B_1$ is set to couple a circuit block (not shown) with the high-voltage power supply, the first output terminal $B_1$ and the first input/output node $D_1$ have voltage levels substantially equal to the first voltage level. The second input/output node $D_2$ has a voltage level substantially equal to the bias voltage level of the gate terminals of the first load 242 and the second load 244 plus a threshold voltage of the second load 244. The second switching circuit 224 is biased to not be completely turned-off, and the second output terminal $B_2$ has a voltage level substantially equal to the elevated ground level. In some embodiments, the elevated ground level is less than the second voltage level, and a difference between the elevated ground level and the second voltage level equals a threshold voltage of the second switching circuit 224. A voltage drop across the drain/source terminals of the transistor of the second load 244 is limited by the elevated ground level at the second output terminal $B_2$ and the second controlled ground terminal $A_2$. Therefore, compared with a configuration setting the second output terminal $B_2$ at the ground, the drain-to-source voltage of the transistor of the second load 244 is reduced. The level of oxide stress and leakage current are also reduced accordingly.

Moreover, during a third period that the voltage level at the first output terminal $B_1$ is switched from the first voltage level to the ground, in some embodiments, the control circuit 210 sets the first controlled ground terminal $A_1$ at the ground and the second controlled ground terminal $A_2$ at the second voltage level. Therefore, the first switching circuit 222 is turned on to couple the first output terminal $B_1$ to the ground.

In the embodiment depicted in FIG. 2, the control circuit 210 includes two NAND gates 212 and 214. In some embodiments, the control circuit has a configuration different than the example shown in FIG. 2.

Figure 3:
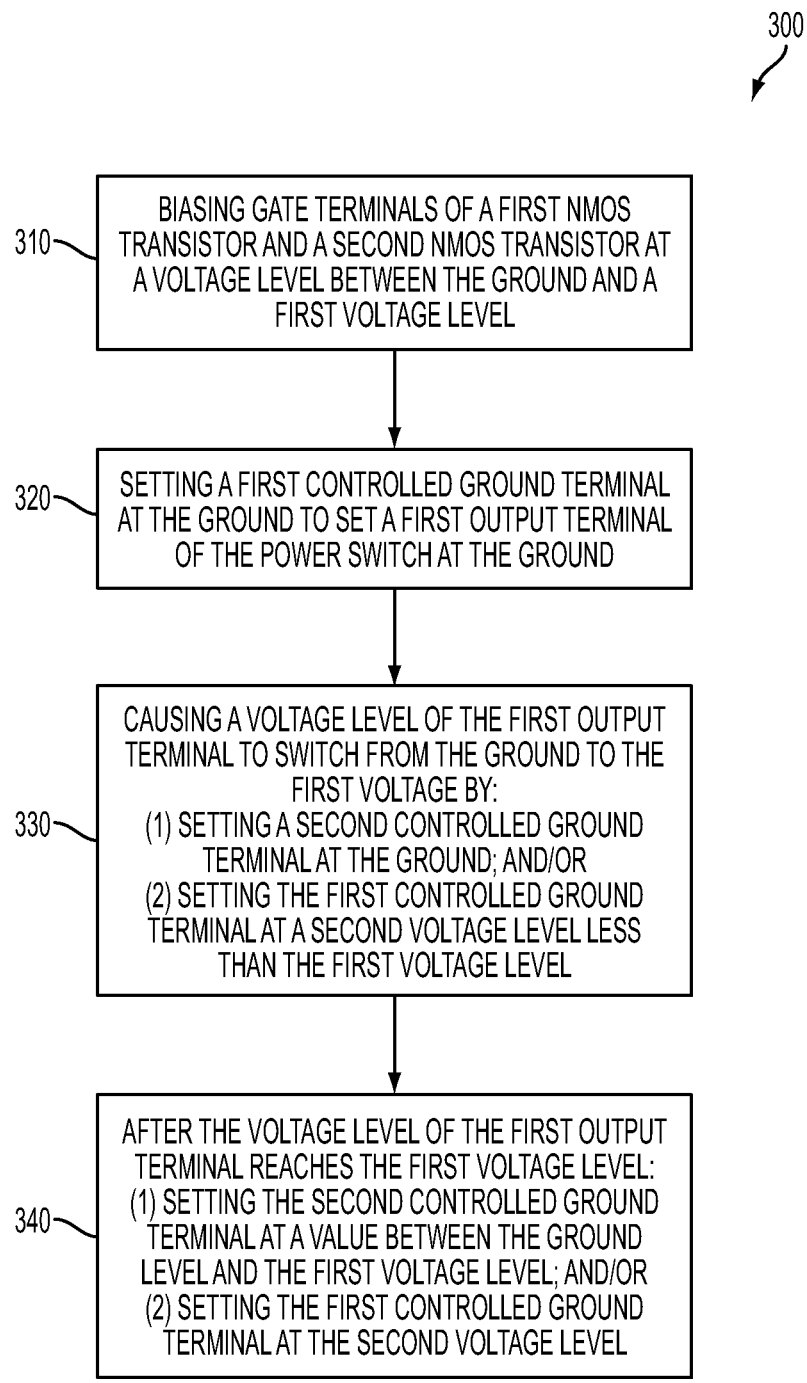
FIG. 3 is a flow chart of a method of operating a power switch in accordance with some embodiments.

FIG. 3 is a flow chart of a method 300 of operating a power switch (such as the power switch 200 in FIG. 2) in accordance with some embodiments. In some embodiments, the power switch has a first NMOS transistor (such as the first switching circuit 222 in FIG. 2) configured to be turned on or turned off in response to a voltage level of a first controlled ground terminal (such as node $A_1$ in FIG. 2) and a second NMOS transistor (such as the second switching circuit 224 in FIG. 2) configured to be turned on or turned off in response to a voltage level of a second controlled ground terminal (such as node $A_2$ in FIG. 2). It is understood that additional processes may be provided before, during, and/or after the method 300 depicted in FIG. 3, and that some other processes may only be briefly described herein.

In operation 310, gate terminals of the first and the second NMOS transistors 222/224 are set at a voltage level between the ground and the first voltage level. In some embodiments, a second voltage level less than the first voltage level is used to bias the gate terminals of the NMOS transistors 222/224. In some embodiments, the first voltage level is a high-voltage level from a high-voltage power supply. In some embodiments, the second voltage level is a low-voltage level from a low-voltage power supply. In at least one embodiment, the first voltage level ranges from about 1.2 volts to 5 volts, and the second voltage level ranges from about 7.5 volts to 18 volts.

In operation 320, a voltage level of the first controlled ground terminal represented by node $A_1$ is set at the ground to turn the first NMOS transistor on, and thus a voltage level of the first output terminal represented by node $B_1$ is set at the ground.

In operation 330, in order to cause the voltage level of the first output terminal $B_1$ to switch from the ground to the first voltage level, a voltage level of the second controlled ground terminal represented by node $A_2$ is set at the ground and/or the voltage level of the first controlled ground terminal $A_1$ is set at the second voltage level. Therefore, the first NMOS transistor 222 is turned off and the second NMOS transistor 224 is turned on, and the voltage level at the first output terminal $B_1$ is pulled from the ground toward the first voltage level.

In operation 340, after the voltage level of the first output terminal $B_1$ reaches the first voltage level, the voltage level of the second controlled ground terminal $A_2$ is set at a value between the ground level and the first voltage level, and/or the voltage level of the first controlled ground terminal $A_1$ is set at the second voltage level. In some embodiments, the value is less than the second voltage level, and a difference between the value and the second voltage level equals a threshold voltage of the second NMOS transistor 224.

Figure 4:
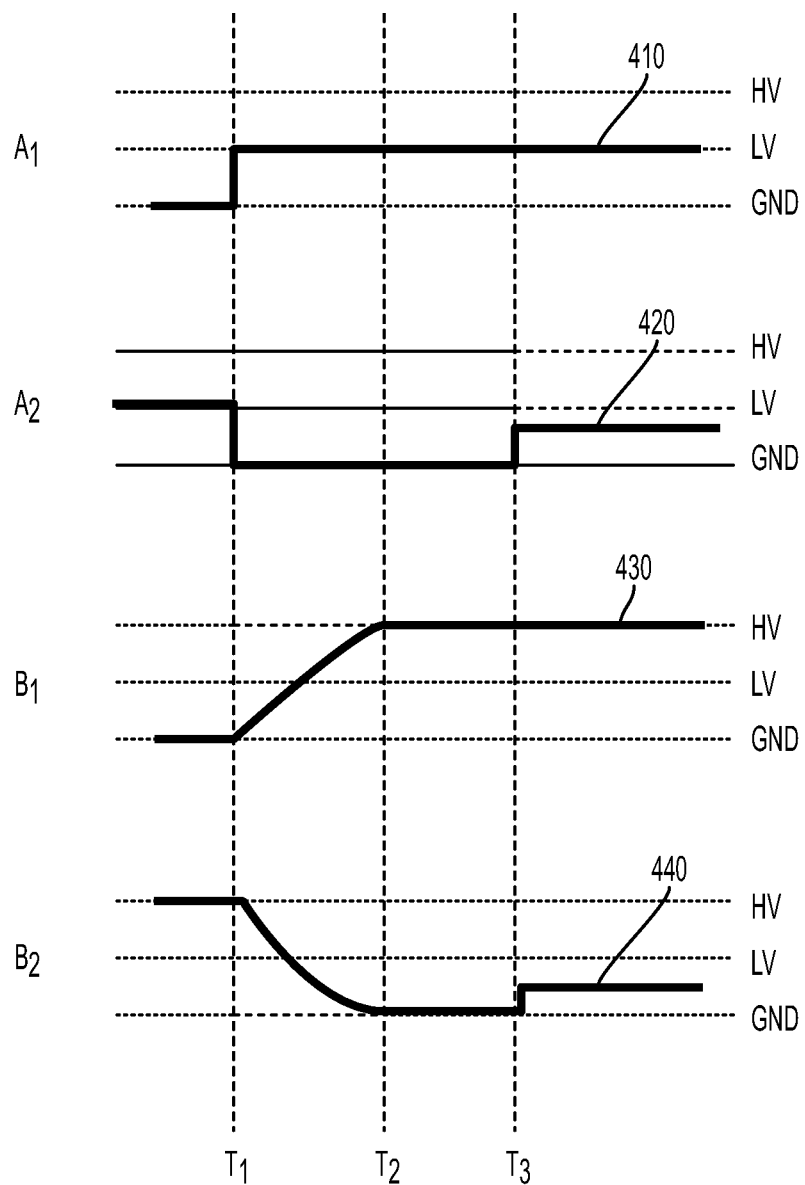
FIG. 4 is a chart of signals of the power switch of FIG. 2 operated in conjunction with the method of FIG. 3 in accordance with some embodiments.

FIG. 4 is a chart of signals of the power switch 200 of FIG. 2 operated in conjunction with the method 300 of FIG. 3 in accordance with some embodiments. Curves 410, 420, 430, and 440 represent the signals over time at nodes $A_1, A_2, B_1,$ and $B_2$, respectively. HV represents the first voltage level from the high-voltage power supply, LV represents the second voltage level from the low-voltage power supply, and GND represents the ground.

Before time $T_1$, gate terminals of the first and the second switches 222/224 are set at the second voltage level LV, which is between the ground GND and the first voltage level HV (corresponding to operation 310). In some embodiments, the gate terminals of the switching circuits 222/224 are biased at a voltage level other than the second voltage level LV. Also, the voltage level at node $A_1$ is set at the ground GND to turn the first switching circuit 222 on, and thus a voltage level at node $B_1$ is set at the ground GND (corresponding to operation 320).

At time $T_1$, as depicted by curves 410/420, the voltage level at node $A_2$ is set at the ground GND, and the voltage level at node $A_1$ is set at the second voltage level LV (corresponding to operation 330). Therefore, the first switching circuit 222 is turned off and the second switching circuit 224 is turned on, and the voltage level at node $B_1$ is pulled from the ground GND toward the first voltage level HV. At time $T_2$, the voltage level at node $B_1$ reaches the first voltage level HV, as depicted by curve 430 at time $T_2$. On the other hand, the voltage level at node $B_2$ is pulled from the first voltage level HV toward the ground GND, as depicted by curve 440 at time $T_2$.

At time $T_3$, as depicted by curves 420/430, after the voltage level at node $B_1$ reaches the first voltage level HV, the voltage level at node $A_2$ is set at a value less than the second voltage level LV, and a difference between the value and the second voltage level LV equals a threshold voltage of the second switching circuit 224. The voltage level at node $B_2$ is pulled up to follow the voltage level of the second controlled ground terminal $A_2$, as depicted by curves 420/440. The voltage level at node $A_1$ is set at the second voltage level LV (corresponding to operation 340) as depicted by curves 410 at time $T_3$. Therefore, a voltage drop across the electrical components connected to node $A_2$ is limited by the elevated ground level.

Figure 5:
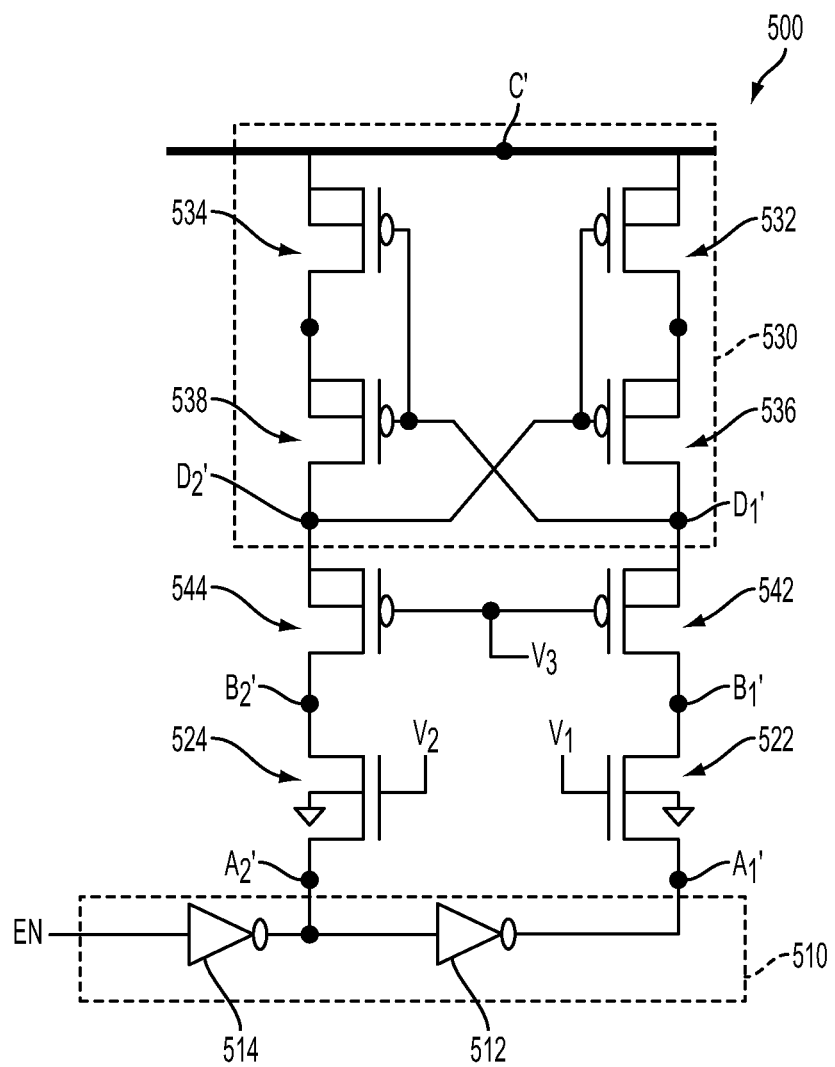
FIG. 5 is a circuit diagram of another power switch in accordance with some embodiments.

FIG. 5 is a circuit diagram of a power switch 500 in accordance with some embodiments. The power switch 500 is also suitable for the application of a power switch 120 depicted in FIG. 1. The power switch 500 includes a control circuit 510, a first switching circuit 522, and a second switching circuit 524. The power switch 500 further includes a cross-coupled amplifier 530 having a power node C', a first input/output node $D_1$', a second input/output node $D_2$', a first load 542, and a second load 544.

The control circuit 510 has a first controlled ground terminal (or node) $A_1$' and a second controlled ground terminal (or node) $A_2$'. The first switching circuit 522 is coupled between a first output terminal (or node) $B_1$' and the first controlled ground terminal $A_1$', and the second switching circuit 524 is coupled between a second output terminal (or node) $B_2$' and the second controlled ground terminal (or node) $A_2$'. The first load 542 is coupled between the first switching circuit 522 and the first input/output node $D_1$'; and the second load 544 is coupled between the second switching circuit 524 and the second input/output node $D_2$'.

The first and second switching circuits 522/524 are the same or similar to the first and second switching circuits 222/224; and the first and second loads 542/544 are the same or similar to the first and second load 242/244. Thus, descriptions with regard to the components that are the same or similar to those depicted in FIG. 2 are omitted.

The cross-coupled amplifier 530 has four PMOS transistors 532, 534, 536, and 538, and each transistor 532, 534, 536, and 538 has a source terminal, a drain terminal, and a gate terminal. The source terminals of PMOS transistors 532 and 534 are connected to the power node C'. The source terminal of PMOS transistor 536 is connected to the drain terminal of the PMOS transistor 532, and the drain terminal of the PMOS transistor 536 is connected to the first input/output node $D_1$'. The source terminal of PMOS transistor 538 is connected to the drain terminal of PMOS transistor 534, and the drain terminal of PMOS transistor 538 is connected to the second input/output node $D_2$'. The gate terminals of PMOS transistors 532 and 536 are connected to the second input/output node $D_2$', and the gate terminals of PMOS transistors 534 and 538 are connected to the first input/output node $D_1$'.

Compared with the cross-coupled amplifier 230 of FIG. 2, the cross-coupled amplifier 530 has cascade transistors 532/536 and 534/538. The cascade configuration allows two or more transistors to split the total voltage drop of the branch, and thus further reduce the level of leakage current and the level of oxide stress on the transistors 532/536 or 534/538.

In some embodiments, the PMOS transistors 532/536 have the same channel width and length, and the PMOS transistors 534/538 have the same channel width and length. In at least one embodiment, the channel width of the PMOS transistors 532, 536, 534, and 538 ranges from about 0.6 μm to 3 μm, and the channel length of the PMOS transistors 532, 536, 534, and 538 ranges from about 0.3 μm to 1.2 μm.

Moreover, the control circuit 510 includes two inverters 512 and 514. The inverters 512/514 are driven by a control signal EN' and selectively set the controlled ground terminals $A_1$'/$A_2$' between the ground and the second voltage level.

FIG. 2 and FIG. 5 depict two embodiments having different example control circuits 210/510 and cross-coupled amplifiers 230/530. Each configuration limits the leakage current and/or reduces the voltage drop upon electrical components of the power switch 200/500. A person having ordinary skill in the art in view of the present disclosure would appreciate that different combinations of the control circuit 210/510 and cross-coupled amplifier 230/530 are possible. For example, in at least one embodiment, the control circuit 210 of the power switch 200 is replaced with the control circuit 530. In at least another embodiment, the cross-coupled amplifier 230 of the power switch 200 is replaced with the cross-coupled amplifier 530.

In at least one embodiment, a power switch includes a control circuit, a first switching circuit, a second switching circuit, and a cross-coupled amplifier. The control circuit has a first controlled ground terminal and a second controlled ground terminal. The first switching circuit is coupled between a first output terminal and the first controlled ground terminal and configured to be turned on or turned off in response to a voltage level of the first controlled ground terminal. The second switching circuit is coupled between a second output terminal and the second controlled ground terminal and configured to be turned on or turned off in response to a voltage level of the second controlled ground terminal. The cross-coupled amplifier has a power node configured to be set at a first voltage level, a first input/output node coupled to the first switching circuit, and a second input/output node coupled to the second switching circuit. The control circuit is configured to connect the second controlled ground terminal to a ground during a first period that a voltage level at the first output terminal is switched from the ground to the first voltage level and to set the second controlled ground terminal at an elevated ground level during a second period that the voltage level at the Page of first output terminal remains at the first voltage level, the elevated ground level being between the ground and the first voltage level.

In at least one embodiment, a method of driving a power switch, where the power switch has a first NMOS transistor configured to be turned on or turned off in response to a voltage level of a first controlled ground terminal and a second NMOS transistor configured to be turned on or turned off in response to a voltage level of a second controlled ground terminal, includes setting the second controlled ground terminal at a ground to cause a voltage level of a first output terminal of the power switch to switch from the ground to a first voltage level, and setting the second controlled ground terminal at a value between the ground level and the first voltage level after the voltage level of the first output terminal reaches the first voltage level.

In at least another embodiment, a power switch includes a first power supply of a first voltage level, a first switching circuit, a second switching circuit, and a cross-coupled amplifier. The first switching circuit is coupled to a first output terminal and configured to selectively couple the first output terminal to a first ground terminal. The second switching circuit is coupled to a second output terminal and configured to selectively couple the second output terminal to a second ground terminal. The cross-coupled amplifier has a power node coupled to the first power supply, a first input/output node coupled to the first switching circuit, and a second input/output node coupled to the second switching circuit. The cross-coupled amplifier includes a first, a second, a third, and a fourth PMOS transistors each having a source terminal, a drain terminal, and a gate terminal. The source terminal of the first PMOS transistor is connected to the power node. The source terminal of the second PMOS transistor is connected to the power node. The source terminal of the third PMOS transistor is connected to the drain terminal of the first PMOS transistor, and the drain terminal of the third PMOS transistor is connected to the first input/output node. The source terminal of the fourth PMOS transistor is connected to the drain terminal of the second PMOS transistor, and the drain terminal of the fourth PMOS transistor is connected to the second input/output node. The gate terminals of the first and third PMOS transistors are connected to the second input/output node, and the gate terminals of the second and fourth PMOS transistors are connected to the first input/output node.

The foregoing outlines features of several embodiments so that those of ordinary skill in the art may better understand the aspects of the present disclosure. Those of ordinary skill in the art should appreciate that they may readily use the present disclosure as a basis for designing or modifying other processes and structures for carrying out the same purposes and/or achieving the same advantages of the embodiments introduced herein. Those of ordinary skill in the art should also realize that such equivalent constructions do not depart from the spirit and scope of the present disclosure, and that they may make various changes, substitutions, and alterations herein without departing from the spirit and scope of the present disclosure.

What is claimed is:

1. A power switch comprising:
    a control circuit having a first controlled ground terminal and a second controlled ground terminal;
    a first switching circuit coupled between a first output terminal and the first controlled ground terminal and configured to be turned on or turned off in response to a voltage level of the first controlled ground terminal;
    a second switching circuit coupled between a second output terminal and the second controlled ground terminal and configured to be turned on or turned off in response to a voltage level of the second controlled ground terminal; and
    a cross-coupled amplifier having a power node configured to be set at a first voltage level, a first input/output node coupled to the first switching circuit, and a second input/output node coupled to the second switching circuit,
    wherein the control circuit is configured to:
        connect the second controlled ground terminal to a ground during a first period that a voltage level at the first output terminal is switched from the ground to the first voltage level;
        set the second controlled ground terminal at an elevated ground level during a second period that the voltage level at the first output terminal remains at the first voltage level, the elevated ground level being between the ground and the first voltage level; and
        set the first controlled ground terminal at a second voltage level during the first period and the second period, the second voltage level being greater than the ground.

2. The power switch of claim 1, wherein the cross-coupled amplifier comprises:
    a first PMOS transistor having a source terminal, a drain terminal, and a gate terminal, the source terminal of the first PMOS transistor connected to the power node;
    a second PMOS transistor having a source terminal, a drain terminal, and a gate terminal, the source terminal of the second PMOS transistor connected to the power node;
    a third PMOS transistor having a source terminal, a drain terminal, and a gate terminal, the source terminal of the third PMOS transistor connected to the drain terminal of the first PMOS transistor, and the drain terminal of the third PMOS transistor connected to the first input/output node; and
    a fourth PMOS transistor having a source terminal, a drain terminal, and a gate terminal, the source terminal of the fourth PMOS transistor connected to the drain terminal of the second PMOS transistor, and the drain terminal of the fourth PMOS transistor connected to the second input/output node,
    the gate terminals of the first and third PMOS transistors being connected to the second input/output node, and the gate terminals of the second and fourth PMOS transistors being connected to the first input/output node.

3. The power switch of claim 2, wherein the first PMOS transistor, the second PMOS transistor, the third PMOS transistor, and the fourth PMOS transistor are configured to have the same channel width and length.

4. The power switch of claim 3, wherein the channel width ranges from 1.5 µm to 3 µm, and the channel length ranges from 0.5 µm to 1.0 µm.

5. The power switch of claim 1, wherein the control circuit is configured to operate within a power domain defined by the ground and the second voltage level, and the second voltage level is less than the first voltage level.

6. The power switch of claim 5, wherein the second switching circuit is an NMOS transistor having a source terminal, a drain terminal, and a gate terminal, the drain terminal of the NMOS transistor connected to the second output terminal, the source terminal of the NMOS transistor connected to the second controlled ground terminal, and the gate terminal of the NMOS transistor being configured to be set at the second voltage level.

7. The power switch of claim 6, wherein the elevated ground level is less than the second voltage level, and a difference between the elevated ground level and the second voltage level equals a threshold voltage of the NMOS transistor.

8. A method of driving a power switch having a first output terminal switching between a ground and a first voltage level greater than the ground, the power switching comprising a first NMOS transistor configured to be turned on or turned off in response to a voltage level of a first controlled ground terminal and a second NMOS transistor configured to be turned on or turned off in response to a voltage level of a second controlled ground terminal, the method comprising:
setting the second controlled ground terminal at a ground and setting the first controlled ground terminal at a second voltage level greater than the ground to cause a voltage level of the first output terminal of the power switch to switch from the ground to the first voltage level; and
setting the second controlled ground terminal at a value between the ground level and the first voltage level and setting the first controlled ground terminal at the second voltage level during a period that the voltage level of the first output terminal remains at the first voltage level.

9. The method of driving a power switch of claim 8, wherein the second voltage level is less than the first voltage level.

10. The method of driving a power switch of claim 8, further comprising:
setting the first controlled ground terminal at the ground to set the first output terminal at the ground.

11. The method of driving a power switch of claim 8, further comprising:
biasing gate terminals of the first and the second NMOS transistors at a voltage level between the ground and the first voltage level.

12. The method of driving a power switch of claim 11, wherein the voltage level used to bias the gate terminals of the first and the second NMOS transistors is the second voltage level.

13. A power switch comprising:
a first power supply of a first voltage level;
a first switching circuit coupled to a first output terminal and configured to selectively couple the first output terminal to a first ground terminal;
a second switching circuit coupled to a second output terminal and configured to selectively couple the second output terminal to a second ground terminal; and
a cross-coupled amplifier having a power node coupled to the first power supply, a first input/output node coupled to the first switching circuit, and a second input/output node coupled to the second switching circuit, the cross-coupled amplifier comprising:
a first PMOS transistor having a source terminal, a drain terminal, and a gate terminal, the source terminal of the first PMOS transistor connected to the power node;
a second PMOS transistor having a source terminal, a drain terminal, and a gate terminal, the source terminal of the second PMOS transistor connected to the power node;
a third PMOS transistor having a source terminal, a drain terminal, and a gate terminal, the source terminal of the third PMOS transistor connected to the drain terminal of the first PMOS transistor, and the drain terminal of the third PMOS transistor connected to the first input/output node; and
a fourth PMOS transistor having a source terminal, a drain terminal, and a gate terminal, the source terminal of the fourth PMOS transistor connected to the drain terminal of the second PMOS transistor, and the drain terminal of the fourth PMOS transistor connected to the second input/output node,
the gate terminals of the first and third PMOS transistors being connected to the second input/output node, and the gate terminals of the second and fourth PMOS transistors being connected to the first input/output node.

14. The power switch of claim 13, further comprising a control circuit configured to:
connect the second ground terminal to a ground during a first period that a voltage level at the first output terminal is switched from the ground to the first voltage level; and
set the second controlled ground terminal at an elevated ground level between the ground and the first voltage level during a second period that the voltage level at the first output terminal remains at the first voltage level.

15. The power switch of claim 14, wherein the control circuit is further configured to:
connect the first ground terminal to the ground during a third period that the voltage level at the first output terminal is at the ground; and
connect the first ground terminal to a second power supply of a second voltage level during the first period and the second period, the second voltage level being less than the first voltage level.

16. The power switch of claim 15, wherein the second switching circuit is an NMOS transistor having a gate terminal, a drain terminal, and a source terminal, the gate terminal of the NMOS transistor connected to the second power supply, the drain terminal of the NMOS transistor connected to the second output terminal, and the source terminal of the NMOS transistor connected to the second ground terminal.

17. The power switch of claim 16, wherein the elevated ground level is less than the second voltage level, and a difference between the elevated ground level and the second voltage level equals a threshold voltage of the NMOS transistor.

18. The power switch of claim 13, wherein the first PMOS transistor, the second PMOS transistor, the third PMOS transistor, and the fourth PMOS transistor are configured to have the same channel width and length.

19. The power switch of claim 18, wherein the channel width ranges from 1.5 μm to 3 μm, and the channel length ranges from 0.5 μm to 1.0 μm.

* * * * *